US010290797B1

(12) United States Patent
Taylor (10) Patent No.: US 10,290,797 B1
(45) Date of Patent: *May 14, 2019

(54) METHOD FOR PRODUCING HIGH-TEMPERATURE SUPERCONDUCTING FILMS HAVING SHARP CHARGE DOPING DISCONTINUITIES

(71) Applicant: THE UNITED STATES OF AMERICA AS REPRESENTED BY THE SECRETARY OF THE NAVY, Washington, DC (US)

(72) Inventor: Benjamin J. Taylor, Escondido, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 208 days.

This patent is subject to a terminal disclaimer.

(21) Appl. No.: 15/200,769

(22) Filed: Jul. 1, 2016

Related U.S. Application Data (60) Provisional application No. 62/301,547, filed on Feb. 29, 2016.

(51) Int. Cl.
*H01L 39/24* (2006.01)
*H01L 39/12* (2006.01)

(52) U.S. Cl.
CPC ............ *H01L 39/126* (2013.01); *H01L 39/24* (2013.01)

(58) Field of Classification Search
CPC .............................. H01L 39/24; H01L 39/126
See application file for complete search history.

(56) References Cited

U.S. PATENT DOCUMENTS

| 5,096,882 A * | 3/1992 | Kato | ........................ H01F 6/06 |
| | | | 204/157.41 |
| 9,188,514 B1 | 11/2015 | Taylor | |
| 2007/0179063 A1* | 8/2007 | Malozemoff | ......... H01L 39/143 |
| | | | 505/329 |

OTHER PUBLICATIONS

Taylor et al. "Correlation of structural, magnetic, and electronic transitions of a novel charge-gradient YBa2Cu3Ox film" Physical Review B 91, 144511 (Year: 2015).*

(Continued)

*Primary Examiner* — Paul A Wartalowicz
(74) *Attorney, Agent, or Firm* — Naval Information Warfare Center Pacific; Kyle Eppele; J. Eric Anderson (57) ABSTRACT

A method includes providing a film having an initial uniform oxygen state on a substrate and annealing the film in a thermal gradient annealing device while applying a steady-state thermal gradient and a uniaxial pressure until the film comprises two or more discrete regions, where at least one of the regions has a final stabilized oxygen state different from the initial uniform oxygen state. The film is a high-temperature compound belonging to the class of compounds having a compositional form of $R_{1-y}M_yBa_2Cu_{3-z}T_zO_x$, where $6 \leq x \leq 7$, where $0 \leq y \leq 1$, where $0 \leq z \leq 1$, where R comprises at least one of a rare earth and calcium, where M comprises at least one of a rare earth distinct from that of R and calcium if absent from R, where T comprises at least one of cobalt (Co), iron (Fe), nickel (Ni), and zinc (Zn).

18 Claims, 5 Drawing Sheets

(56) References Cited

OTHER PUBLICATIONS

Taylor et al. "Preparation of novel HTS films and tunnel junctions for advanced C3I sensor applications." Proceedings vol. 9467, Mircro- and Nanotechnology Sensors, Systems, and Applications VII. (Year: 2015).*
Foley, C. P., and Hilgenkamp, H., "Why NanoSQUIDs are important: an introduction to the focus issue," Supercond. Sci. Technol. 22, 064001 (2009).
De Andrade, M. C., Leese de Escobar, A., Taylor, B. J., Berggren, S., Higa, B., Dinh, S., Fagaly, R. L., Talvacchio, J., Nechay, B., and Przybysz, J., "Detection of Far Field Radio Frequency Signals by Niobium Superconducting Quantum Interference Device Arrays," IEEE Trans. Appl. Supercond, submitted (2015).
Berggren, S., Fagaly, R. L., and Leese de Escobar, A. M., "Superconducting Quantum Interference Devices Arranged in Pyramid Shaped Arrays," IEEE Trans. Appl. Supercond. 25, 1600605 (2015).
S. Y. Yang, et al., "Above-bandgap voltages from ferroelectric photovoltaic devices," Nature Nanotechnology, 5, 143 (2010).
Lindemer, T. B., Hunley, J. F., Gates, J. E., Sutton Jr., A. L., Brynestad, J., Hubbard, C. R., and Gallagher, P. K., "Experimental and Thermodynamic Study of Nonstoichiometry in <YBa2Cu3O7?x>," J. Am. Ceram. Soc. 72, 1775 (1989).
Wu, C. H., Jhan, F. J., Chen, J. H., and Jeng, J. T., "High-Tc Josephson junctions fabricated by focused ion beam direct milling," Supercond. Sci. Technol. 26, 025010 (2013).
Baetzold, R. C., "Atomistic simulation of ionic and electronic defects in YBa2Cu3O7," Phys. Rev. B 38, 11304 (1988).
Chandrasekhar, N., Valls, O. T., and Goldman, A. M., "Charging effects observed in YBa2Cu3O7?x films: Influence of oxygen ordering," Phys. Rev. B 49, 6220 (1994).
Grigelionis, G., Tornau, E. E., and Rosengren, A. "Effect of an electric field on oxygen ordering and superconducting temperature of YBa2Cu3O6+x thin films," Phys. Rev. B 53, 425 (1996).
Liang, R., Bonn, D. A., and Hardy, W. N., "Evaluation of CuO2 plane hole doping in YBa2Cu3O6+x single crystals," Phys. Rev. B 73, 180505(R) (2006).
De Fontaine, D., Cedar, G., and Asta, M. , "Low-temperature long-range oxygen order in YBa2Cu3Oz," Nature 343, 544 (1990).
McCormack, R. , de Fontaine, D., and Ceder, G., "Oxygen configurations and their effect on charge transfer in off-stoichiometric YBa2Cu3Oz," Phys. Rev. B 45, 12976 (1992).
De Fontaine, D., Ozolins, V. , Islam, Z., and Moss, S. C., "Origin of modulated structures in YBa2Cu3O6:63: A first-principles approach," Phys. Rev. B 71, 212504 (2005).
Michalowski, P., Shapoval, T., Meier, D., Katzer, C., Schmidl, F., Schultz, L., and Seidel, P., "Enhancement of high-Tc superconducting thin film devices by nanoscale polishing," Supercond. Sci. Technol. 25, 115019 (2012).
Mitchell, E. E., and Foley, C. P., "YBCO step-edge junctions with high IcRn," Supercond. Sci. Technol. 23, 065007 (2010).
Du, J., Lazar, J. Y., Lam, S. K. H., Mitchell, E. E. and Foley, C. P., "Fabrication and characterisation of series YBCO step-edge Josephson junction arrays," Supercond. Sci. Technol. 27, 095005 (2014).
Cybart, S. A., Cho, E. Y., Wong, T. J., Glyantsev, V. N., Huh, J. U., Yung, C. S., Moeckly, B. H., Beeman, J.W., Ulin-Avila, E.,Wu, S. M., and Dynes, R. C., "Large voltage modulation in magnetic field sensors from two-dimensional arrays of YBa—Cu—O nano Josephson junctions," Appl. Phys. Lett. 104, 062601 (2014).
Cybart, S. A., Cho, E. Y., Wong, T. J., Wehlin, B. H., Ma, M. K., Huynh, C., and Dynes, R. C., "Nano Josephson Superconducting Tunnel Junctions in Y—Ba—Cu—O Direct-Patterned with a Focused Helium Ion Beam," arXiv:1409.4876v1 (2014).
Wu, C. H., Chou, Y. T., Kuo, W. C., Chen, J. H., Wang, L. M., Chen, J. C., Chen, K. L., Sou, U. C., Yang, H. C., and Jeng, J. T., "Fabrication and characterization of high-Tc YBa2Cu3O7? nanoSQUIDs made by focused ion beam milling," Nanotechnology 19, 315304 (2008).
Arpaia, R., Arzeo, M., Nawaz, S., Charpentier, S., Lombardi, F., and Bauch, T., "Ultra low noise YBa2Cu3O7 nano superconducting quantum interference devices implementing nanowires," Appl. Phys. Lett. 104, 072603 (2014).
Sirena, M., Matzen, S., Bergeal, N., Lesueur, J., Faini, G., Bernard, R., Briatico, J., and Crete, D. G. "Improving ion irradiated high Tc Josephson junctions by annealing: The role of vacancy-interstitial annihilation," Appl. Phys. Lett. 91, 142506 (2007).
MoberlyChan, W. J., Adams, D. P., Aziz, M. J., Hobler, G., and Schenkei, T., "Fundamentals of Focused Ion Beam Nanostructural Processing: Below, At, and Above the Surface," MRS Bulletin 32, 424 (2007).
Blamire, M. G., MacManus-Driscoll, J. L., Mathur, N. D., and Barber, Z. H., "The Materials Science of Functional Oxide Thin Films," Adv. Mater, 21, 3827 (2009).
Cojocaru, C.-V., Nechache, R., Hamagea, C., Pignolet, A., and Rosei, F., "Nanoscale patterning of functional perovskite-type complex oxides by pulsed laser deposition through a nanostencil," Appl. Surf. Sci. 256, 4777 (2010).
Chen, H. H., Urquidez, O. A., Ichim, S., Rodriquez, L. H., Brenner, M. P., Aziz, M. J., "Shocks in Ion Sputtering Sharpen Steep Surface Features," Science 310, 294 (2005).
Tang, L., "Rewritable Oxide Photodetectors", Nature Photonics, vol. 4, pp. 807-809, 2010.
Baek, S.H. et al., "Ferroelastic switching for nanoscale non-volatile magnetoelectric devices", Nature Materials, vol. 9, pp. 309-314; 2010.
Green, M.A., "The emergence of perovskite solar cells", Nature Photonics, vol. 8, pp. 506-514, 2014.

* cited by examiner

METHOD FOR PRODUCING HIGH-TEMPERATURE SUPERCONDUCTING FILMS HAVING SHARP CHARGE DOPING DISCONTINUITIES

CROSS-REFERENCE TO RELATED APPLICATIONS

This application claims the benefit of U.S. Provisional Patent Application Ser. No. 62/301,547 filed Feb. 29, 2016, entitled "Method for Producing Films Having Sharp Charge Doping Discontinuities", the content of both of which being fully incorporated by reference herein.

FEDERALLY SPONSORED RESEARCH AND DEVELOPMENT

The Method for Producing High-Temperature Superconducting Films Having Sharp Charge Doping Discontinuities is assigned to the United States Government. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil. Reference Navy Case No. 103672.

BACKGROUND

Commercial and scientific applications of high-temperature superconducting (HTS) materials are rapidly growing as fabrication and production technologies advance in precision and scale. The Josephson junction (JJ), a weak link between two superconductors, is an active element that serves as the building block of a wide segment of superconducting electronic circuits and devices. As superconducting circuitry and devices become more commonplace, there exists a need to integrate functionality with that of other common devices such photovoltaics, nano-scale optoelectronics, and non-volatile magneto-electric devices. The method described herein addresses such a need via the controlled formation of HTS films having distinct regions of differing oxygen content resulting in formation of sharp charge doping boundaries.

DETAILED DESCRIPTION OF SOME EMBODIMENTS

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

The evolution of the physical properties of high critical temperature (high-$T_c$) superconducting (HTS) cuprates across the charge doping-temperature, p-T, phase diagram have been extensively studied. An accurate understanding of this 'map' is essential to both the task of determining the mechanism of superconductivity in these materials and in developing technological applications. In many of the HTS compounds, the oxygen content controls the level of charge carrier (hole/electron) doping, which in turn determines the various possible electronic ground states, including the temperature $T_c$ at which the material becomes superconducting. In the case of one particular HTS, $YBa_2CuO_x$, where $6 \leq x \leq 7$, the structure is such that oxygen content varies within the Cu—O chains, which are aligned along the b-axis of the lattice. The level of oxygen within the Cu—O chains subsequently, via a charge transfer process, determines the level of hole-doping in the $CuO_2$ planes where superconductivity, i.e., the pairing of electrons, takes place.

Given that the oxygen level determines the charge carrier concentration, an abrupt change in oxygen content over a distance of a few unit cells will result in the formation of an electro-static field across this region. The embodiments disclosed herein involve a method by which films of certain HTS materials may be produced where permanent high internal static electric fields are established at boundaries which form in the film. Films produced using the embodiments disclosed herein may be used in various types of applications. For example, these devices can include photovoltaics, nano-scale optoelectronics, non-volatile magneto-electric devices, and solar cells. Further, the films produced may provide a particularly efficient means to couple optical/opto-electronic functionality to superconducting circuitry and devices.

Figure 1:
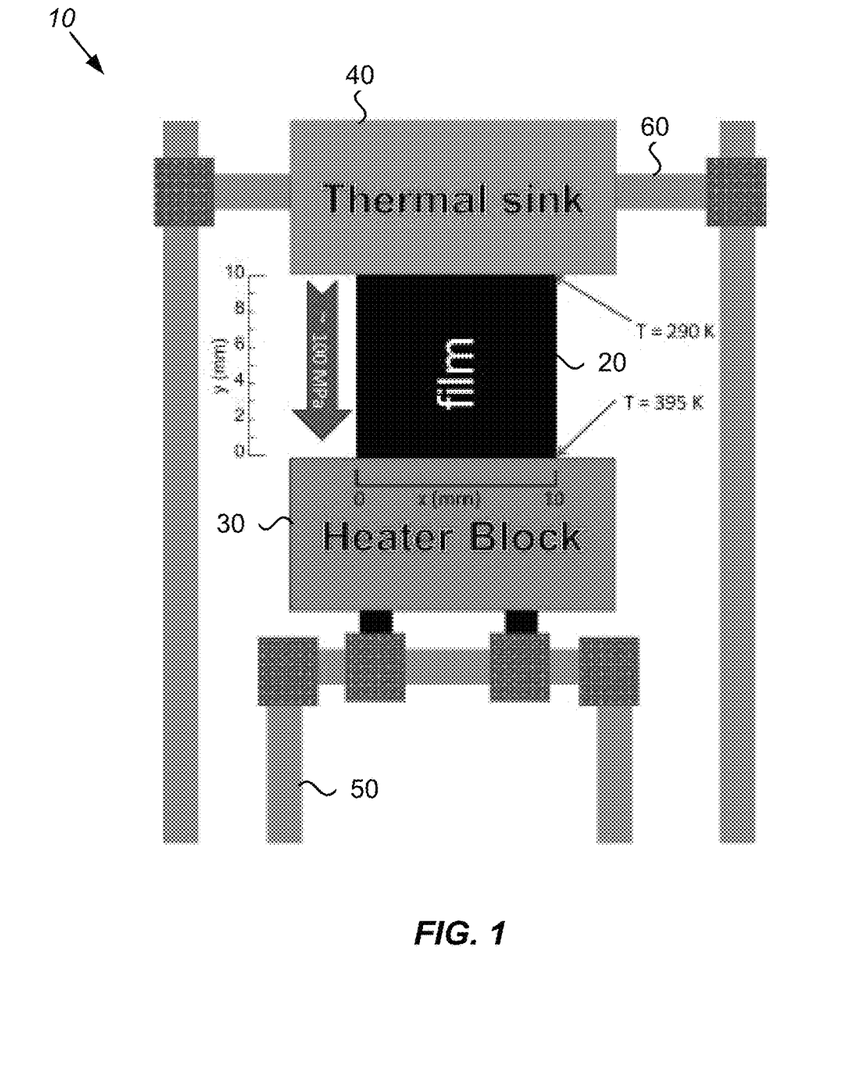
FIG. 1 shows a diagram of a system that may be used to produce films in accordance with Method for Producing High-Temperature Superconducting Films Having Sharp Charge Doping Discontinuities.

In some embodiments, the method includes the steps of growing a film with a uniform oxygen content and the annealing the film in a thermal gradient annealing device with the application of sufficient uniaxial pressure to drive the oxygen into various superstructure states. FIG. 1 shows an embodiment of a system 10 that may be used to produce films in accordance with embodiments of the method. System 10 includes a film 20 in thermal contact with a heat source 30 and a heat sink 40. In some embodiments, film 20 is physically in contact with heat source 30 and heat sink 40. In some embodiments, film 20 is held in place between heat source 30 and heat sink 40 via an applied pressure.

Film 20 is a sample of a chemical compound and may comprise any size or shape. Examples of film 20 include $YBa_2Cu_3O_x$ and similar oxide compounds, fluorine doped Fe—As superconducting compounds and similar pnictide compounds, pure metal or metallic alloys with diffusive hydrogen, optical materials annealed in a reactive gas, or any such chemical compound that exhibits useful changes in physical properties upon undergoing an annealing process. Film 20 may be a deposited film or a single or large grain crystalline material. For instance, in the case where film 20 is a uniformly overdoped ($p \gtrsim 0.20$) cuprate superconductor single crystal or film, the sample may initially be prepared with either a uniform high (maximum) or low (minimum) oxygen content. For example, using $YBa_2Cu_3O_x$, the oxygen content, x, can be between 6 or 7, where 6 is low and 7 is high. The low/high criterion is determined by the minimum/maximum amount of oxygen (diffusive molecule) that the parent/host compound can reversibly uptake or expel without undergoing an irreversible chemical breakdown into new stoichiometric compounds.

Heat source 30 is set to a first temperature and heat sink 40 is set to a second temperature. The difference in temperatures between heat source 30 and heat sink 40 may depend upon various factors such as the composition of the sample material, the desired gradient for the sample material, and the gas and pressure used in the atmospheric chamber. In some embodiments, the first temperature is a temperature above a characteristic thermal activation temperature of the sample at which at least some of the diffusive atomic constituents, such as oxygen, nitrogen, and hydrogen are able to diffusively move in and out of the parent material, such as $YBa_2Cu_3O_x$, yttria stabilized zirconia, and tantalum or palladium, respectively, in a gaseous phase, while the second temperature is a temperature below this characteristic thermal activation temperature. Such temperatures are known to those having ordinary skill in the art and are readily available in the literature. As an example, heat source 30 and heat sink 40 may be heater blocks. In some embodiments, the temperatures of heat source 30 and heat sink 40 may be set and variably controlled using temperature controllers (not shown) connected thereto.

Heat source 30 is secured to a support 50 and heat sink 40 is secured to a support 60, such that heat sink 40 is positioned directly above and separated from heat source 30. In other embodiments, heat source 30 and heat sink 40 may be oriented differently with respect to one another. As an example, supports 50 and 60 may comprise adjustable stainless steel frames. However, other configurations and materials may be used for supports 50 and 60 as would be recognized by one having ordinary skill in the art.

Although the embodiments herein are discussed with reference to the high-temperature (high-$T_c$) superconducting compound $YBa_2CuO_x$, where $6 \leq x \leq 7$, the embodiments are generally applicable to all known variations of high-temperature superconducting films involving chemical and isotope substitutions for each of the constituent elements. For example, substitutions may involve use of other rare earth elements, calcium, and the transition metals Ni and Zn.

In some embodiments, the substrate comprises one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ), or any combination thereof or of similar materials.

The embodiments of the method disclosed herein may be used to systematically investigate the physical properties of the $YBa_2Cu_3O_x$ system as a function of oxygen content wherein a fully oxygenated $YBa_2Cu_3O_7$ film is annealed in a low-pressure pure oxygen atmosphere while a steady-state thermal gradient is applied across the length of the film, resulting in a $YBa_2Cu_3O_{\nabla x}$ film. A film prepared in this manner has a monotonically varying oxygen content along the direction in which the applied thermal gradient was applied.

However, rather than a smooth evolution of oxygen content along the entire sample length, three physically distinct regimes of oxygen distribution are observed such that, above $x \cong 6.89$ and below $x \cong 6.72$ the oxygen distribution smoothly varies along the sample length, but a discontinuity in oxygen content arises due to a large central region of the film stabilizing with an oxygen content of $x \cong 6.81$. No oxygenation states exist in the interval $x \cong [6.72-6.89]$ except for $x \cong 6.81$. The values of oxygen content, $x=6.72$, 6.81, and 6.89, correspond to $CuO_2$ hole doping values of $p=1/8$, $1/7$, and $1/6$, respectively. The $p=1/6$ state lies close to the optimal doping value where the highest value of $T_c$ is obtained. The $p=1/8$ and $1/7$ doping values correspond to well-ordered Cu—O chain configurations wherein the oxygen sites within individual Cu—O chains are completely occupied or completely empty. The repeating patterns of full and empty chains form throughout the entire lattice. Following the notation introduced by de Fontaine, et al., (*Nature* (*London*) 343, 544 (1990)), the notation <1> and <10> denote the Ortho I (full chain) and Ortho II (half-empty chain) states where a one or zero indicates a completely full or empty Cu—O chain, respectively. The $p=1/7$ and $1/8$ doping levels are equivalent to the $<1^4 0>$, and $<1^3 0110>$ states, where an exponent denotes a repeated structure. At oxygen levels where fully ordered chains are not possible, the oxygen in the chains tends to order in randomly distributed chain fragments which are super-positions of the fully ordered chain states.

In practice of one embodiment of the method, a uniform $YBa_2Cu_3O_x$ film with a thickness of t≈1500 nm was grown on a <001> $SrTiO_3$ substrate (l×w=1.0 cm×1.0 cm) via the pulsed laser ablation method using a 248-nm laser. The target material used for the ablation process was prepared from stoichiometric quantities of $Y_2O_3$, $Ba(NO_3)_2$, and CuI. The film was deposited at 755° C. in 115 mTorr of flowing oxygen with the incoming gas directed into the laser plume directly above the substrate/film. Immediately following the film growth process, the oxygen pressure in the chamber was increased to 950 Torr at a rate of ≈100 Torr/min. The oxygen was flowed into the chamber through an alternate inlet such that the gas was not flowing across the sample. Concurrent with the increase in chamber pressure, the film was cooled to 450° C. at a rate of 10° C./min and annealed at ≈950 Torr for a period of 12 hours. The sample was finally cooled to room temperature in a fully oxygenated x=7:0 state at rate of 5° C./min. The oxygen pressure at this temperature was 860 Torr.

From this uniformly doped $YBa_2Cu_3O_7$ film, a $YBa_2Cu_3O_{\nabla x}$ film was prepared using the apparatus and method described in a publication to Taylor et al., "Correlation of structural, magnetic, and electronic transitions of a charge gradient $YBa_2Cu_3O_{\nabla x}$ film, *Phys. Rev. B*, 2015, with the only difference being that the film prepared and examined herein was annealed in a slightly higher oxygen atmosphere with $P_{O_2}$=120 mTorr. The annealing apparatus applies heat to one edge of the substrate/film with the opposite edge of the substrate/film in contact thermally sunk—resulting in a linear thermal gradient across the sample ranging from about 395° C. to about 290° C.

Figure 2:
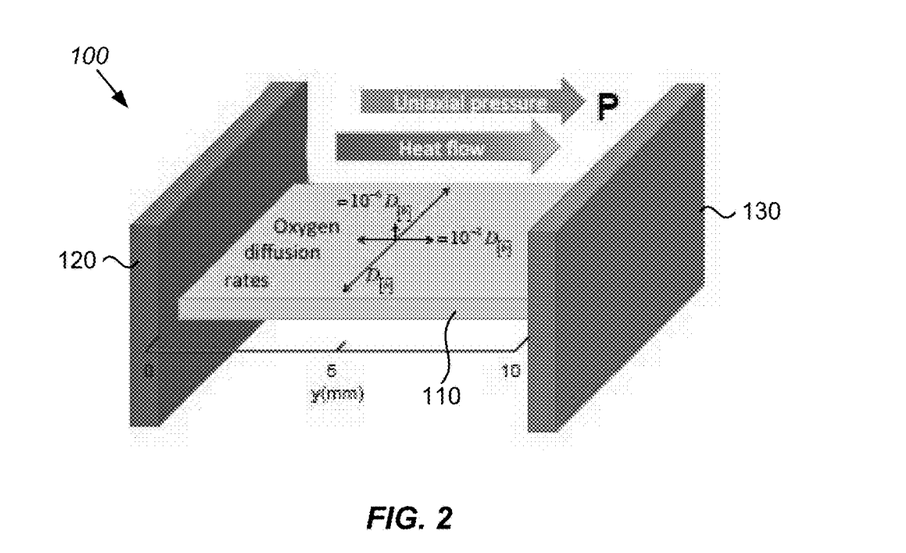
FIG. 2 shows a diagram illustrating the direction of uniaxial pressure and heat flow during production of a film in accordance with Method for Producing High-Temperature Superconducting Films Having Sharp Charge Doping Discontinuities.

FIG. 2 shows a diagram 100 illustrating the direction of uniaxial pressure and heat flow during production of a film as discussed above. As shown, a film 110 is disposed between a heat source 120 and a heat sink 130. The uniaxial pressure is applied in the same direction as the heat flow, which occurs from heat source 120 to heat sink 130. Such a configuration provides a film 110 having discrete regions of different oxygen states as shown in FIG. 3.

Figure 3:
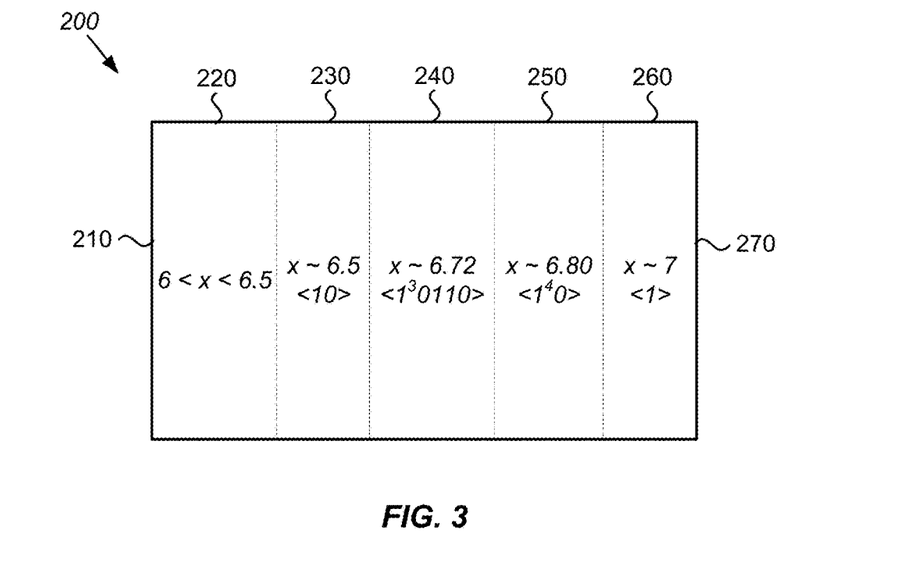
FIG. 3 shows a diagram illustrating a film with discrete regions of different oxygen states produced in accordance with the Method for Producing High-Temperature Superconducting Films Having Sharp Charge Doping Discontinuities.

FIG. 3 shows a diagram illustrating a film 200 with discrete regions of different oxygen states produced in accordance with the embodiments of the method. Film 200 has a first end 210 and a second end 270. First end 210 is the end that was in contact with the heat source, such as heat source 120 shown in FIG. 2. Second end 270 is the end that was in contact with the heat sink, such as heat sink 130 shown in FIG. 2. Film 200 has five discrete regions 220, 230, 240, 250, and 260. In region 220 a final stabilized oxygen state exists with an oxygen content x being between 6 and 6.5. In region 230 a final stabilized oxygen state <10> exists with an oxygen content of about 6.5. In region 240 a final stabilized oxygen state $<1^3 0110>$ exists with an oxygen content of about 6.72. In region 250 a final stabilized oxygen state $<1^4 0>$ exists with an oxygen content of about 6.80. In region 260 a final stabilized oxygen state <1> exists with an oxygen content of about 7.0.

Figure 4:
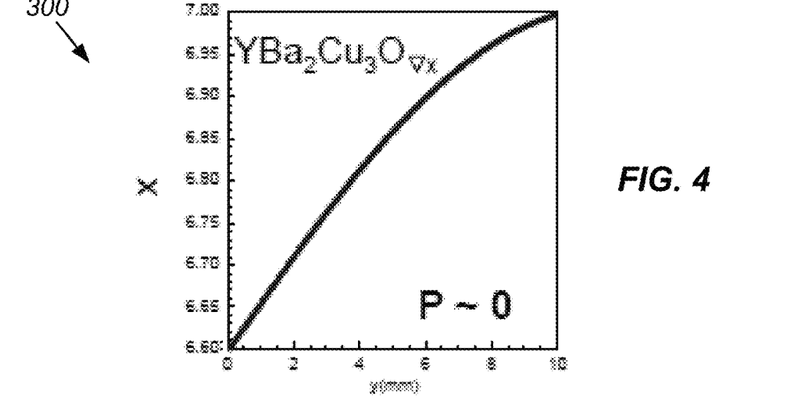
FIG. 4 shows a graph illustrating oxygen content x versus sample position y for a $YBa_2CuO_x$ film annealed with no uniaxial pressure applied.
Figure 5:
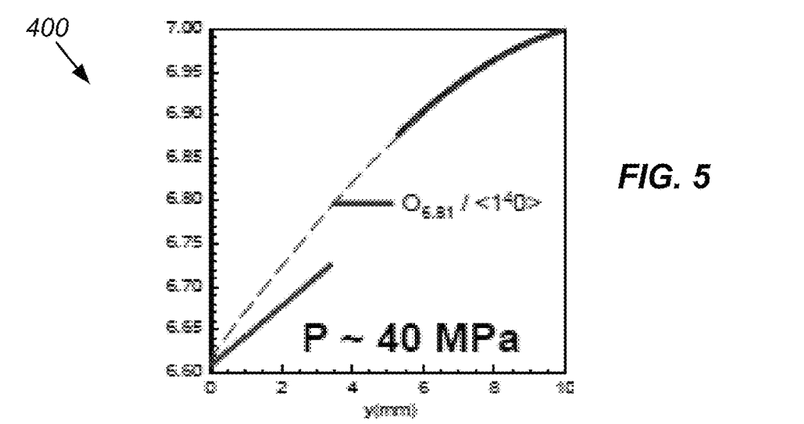
FIG. 5 shows a graph illustrating oxygen content x versus sample position y for a $YBa_2CuO_x$ film annealed with a uniaxial pressure of about 40 MPa applied.
Figure 6:
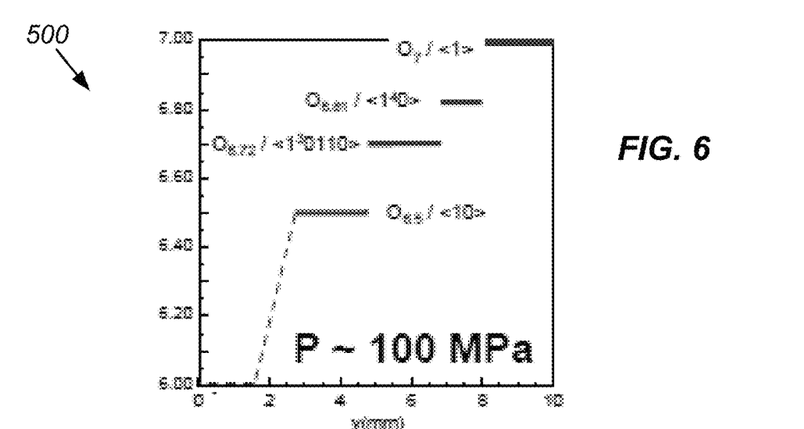
FIG. 6 shows a graph illustrating oxygen content x versus sample position y for a $YBa_2CuO_x$ film annealed with a uniaxial pressure of about 100 MPa applied.

Referring to FIGS. 4-6, FIG. 4 shows a graph 300 illustrating oxygen content x versus sample position y for a $YBa_2CuO_x$ film annealed with no uniaxial pressure applied, FIG. 5 shows a graph 400 illustrating oxygen content x versus sample position y for a $YBa_2CuO_x$ film annealed with a uniaxial pressure of about 40 MPa applied, and FIG. 6 shows a graph 500 illustrating oxygen content x versus sample position y for a $YBa_2CuO_x$ film annealed with a uniaxial pressure of about 100 MPa applied. As shown in FIGS. 4-6, as a uniaxial pressure is applied in increasing levels, the fully-ordered oxygen chain states are stabilized across large regions of the film. In the absence of pressure, as depicted in FIG. 4, a continuously varying oxygen content results across the film in accordance with the local temperature and the given atmospheric oxygen pressure. The application of uniaxial pressure induces ordering of the crystalline lattice into the primary superstructures, <1>, $<1^4 0>$, etc.

Figure 7:
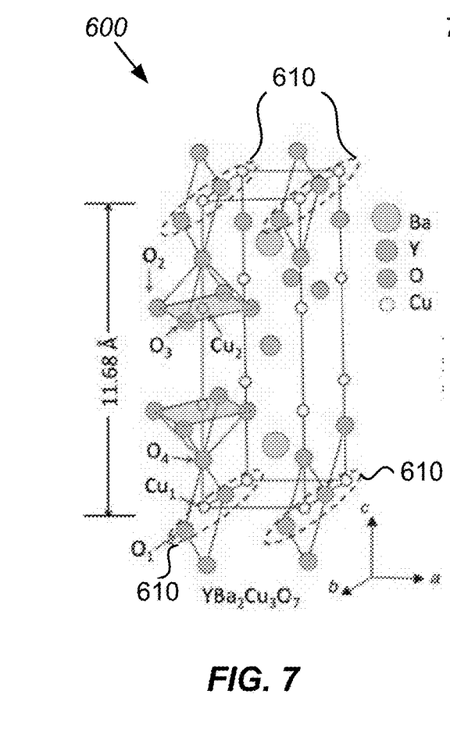
FIG. 7 shows a diagram illustrating a lattice unit cell of fully oxygenated $YBa_2Cu_3O_7$.

FIG. 7 shows a diagram 600 illustrating a lattice unit cell of fully oxygenated $YBa_2Cu_3O_7$. The Cu—O chains 610 are shown by dashed ovals. Oxygen doping occurs through the Cu—O chains.

Figure 8:
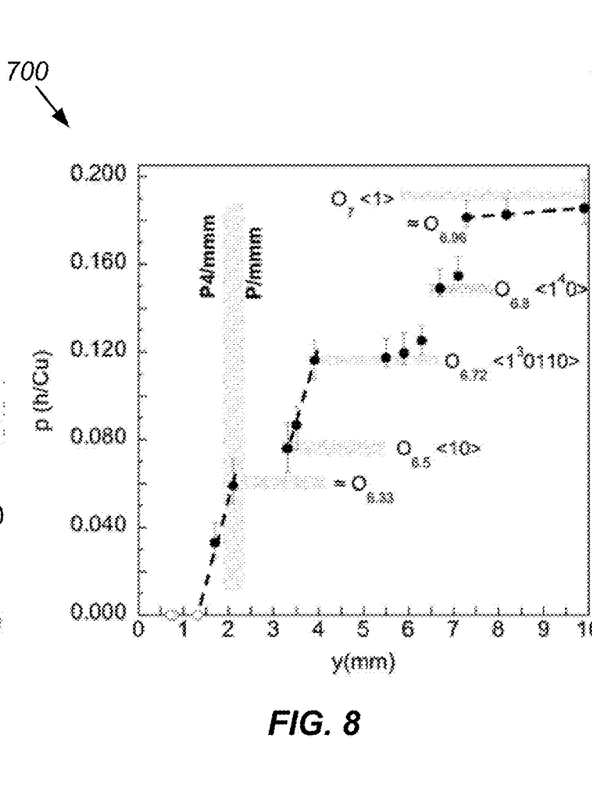
FIG. 8 shows a diagram illustrating hole concentration versus sample position for the $YBa_2Cu_3O_7$ lattice unit cell shown in FIG. 7.

FIG. 8 shows a diagram 700 illustrating hole concentration p versus sample position y for a $YBa_2Cu_3O_{\nabla x}$ film subjected to ~100 MPa pressure. The values of p shown are determined from the values of c(nm) given in Table 1 below, with such values determined using Eq. 2 of a publication to Liang et al. entitled "Evaluation of $CuO_2$ plane hole doping in $YBa_2Cu_3O_{6+x}$ single crystals", *Phys. Rev. B*, 73, (2006). The profile column represents the profile of a trench created by subsequently ion milling the film, with d representing the depth of the trench as a function of sample position.

TABLE 1

| y(mm) | c(nm)   | p(h/Cu) | Profile | d(nm) |
|-------|---------|---------|---------|-------|
| 9.90  | 1.16851 | 0.1857  | V       | 321   |
| 8.18  | 1.16866 | 0.1826  | V       | 328   |
| 7.29  | 1.16872 | 0.1814  | V       | 318   |
| 7.10  | 1.17018 | 0.1546  | V       | 320   |
| 6.70  | 1.17053 | 0.1490  | V       | 299   |
| 6.29  | 1017220 | 0.1254  | V       | 307   |
| 5.89  | 1.17267 | 0.1195  | ⌴       | 394   |
| 5.50  | 1.17282 | 0.1177  | ⌴       | 444   |
| 3.90  | 1.17294 | 0.1163  | ⌴       | 460   |
| 3.50  | 1.17562 | 0.0867  | ⌴       | 472   |
| 3.31  | 1.17667 | 0.0761  | ⌴       | 476   |
| 2.11  | 1.17839 | 0.0591  | *       | *     |
| 1.70  | 1.18104 | 0.0333  | ⌴       | 482   |
| 1.31  | 1.18496 | ~0      | ⌴       | 485   |
| 0.78  | 1.18757 | ~0      | ⌴       | 489   |
| 0.71  | 1.19013 | ~0      | ⌴       | 492   |

Figure 9:
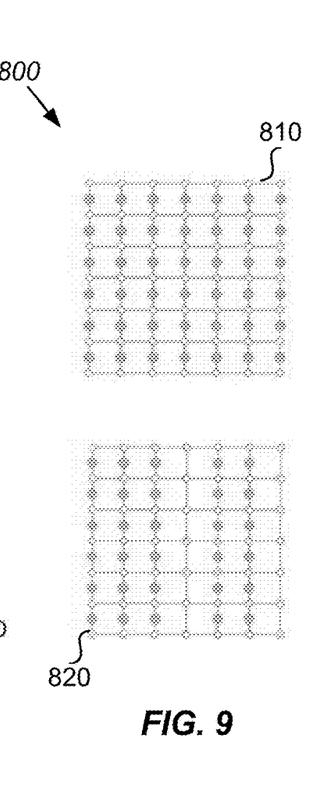
FIG. 9 shows diagrams illustrating oxygen ordering in the plane of the $YBa_2Cu_3O_7$ lattice unit cell shown in FIG. 7 containing the Cu—O chains.

FIG. 9 shows diagrams illustrating oxygen ordering in the plane of the $YBa_2Cu_3O_7$ lattice unit cell shown in FIG. 7 containing the Cu—O chains. The top diagram 810 represents the well-ordered chain state with x=7.0 <1> (fully doped), while the bottom diagram 820 represents the well-ordered chain state with x≈6.72 $<1^3 0110>$ (⅛th doped). Within the oxygen ordering model for $YBa_2Cu_3O_x$, ordering within the Cu—O chain layer is described through a branching algorithm wherein the Ortho I (c=0.50) and Ortho II (c=0.25), (z=2c+6), structures are the generating structures for those of successive levels. The notation <1> and <10> denote the Ortho I and Ortho II chain states where a one or zero indicates a completely full or empty Cu—O chain, respectively, and an exponent denotes a repeated structure. The Ortho III structure, <110>, arises from the Ortho I and II structures, i.e., <1>+<10>→<110>, and so forth.

Figure 10:
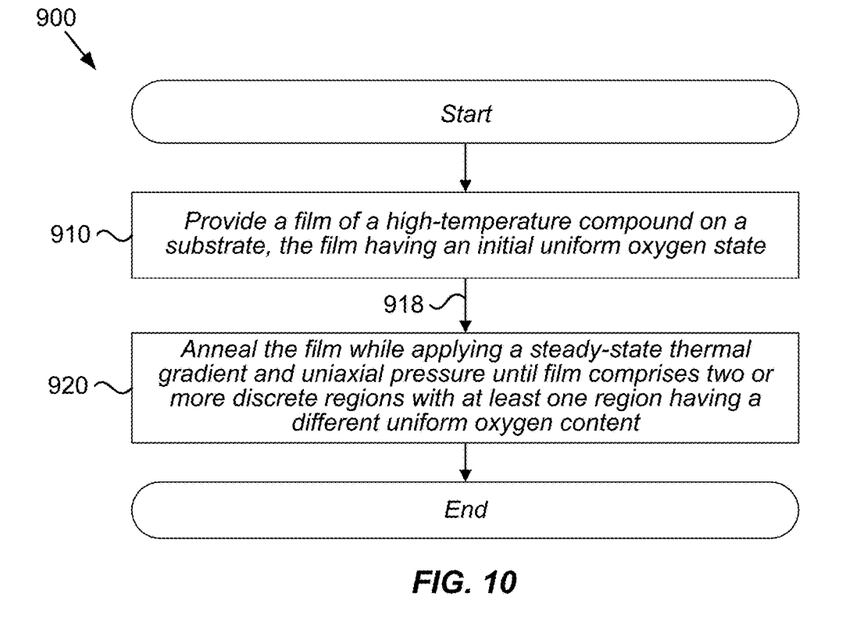
FIG. 10 shows a flowchart of an embodiment of a method in accordance with the Method for Producing High-Temperature Superconducting Films Having Sharp Charge Doping Discontinuities.

FIG. 10 shows a flowchart of an embodiment of a method 900 in accordance with the Method for Producing High-Temperature Superconducting Films Having Sharp Charge Doping Discontinuities. As an example, method 900 may be performed by system 10 as shown in FIG. 1. Also, while FIG. 10 shows one embodiment of method 900 to include steps 910-930, other embodiments of method 900 may contain fewer or more steps. Further, while in some embodiments the steps of method 900 may be performed as shown in FIG. 10, in other embodiments the steps may be performed in a different order, or certain steps may occur simultaneously with one or more other steps.

Method 900 may begin with step 910, which involves providing a film on a substrate, where the film has an initial uniform oxygen state. As discussed above, the film comprises a high-temperature compound belonging to the class of compounds having a compositional form of $R_{1-y}M_yBa_2Cu_{3-z}T_zO_x$, wherein 6≤x≤7, wherein 0≤y≤1, wherein 0≤z≤1, wherein R comprises at least one of a rare earth and calcium, wherein M comprises at least one of a rare earth distinct from that of R and calcium if absent from R, wherein T comprises at least one of cobalt (Co), iron (Fe), nickel (Ni), and zinc (Zn).

The substrate may have at least one of the following characteristic: a structurally matching lattice interface to the film, a melting point in a range of at least approximately 800° C., a non-reactive chemical composition, and at least one insulating electrical property. In some embodiments, the substrate comprises one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ).

Figure 11:
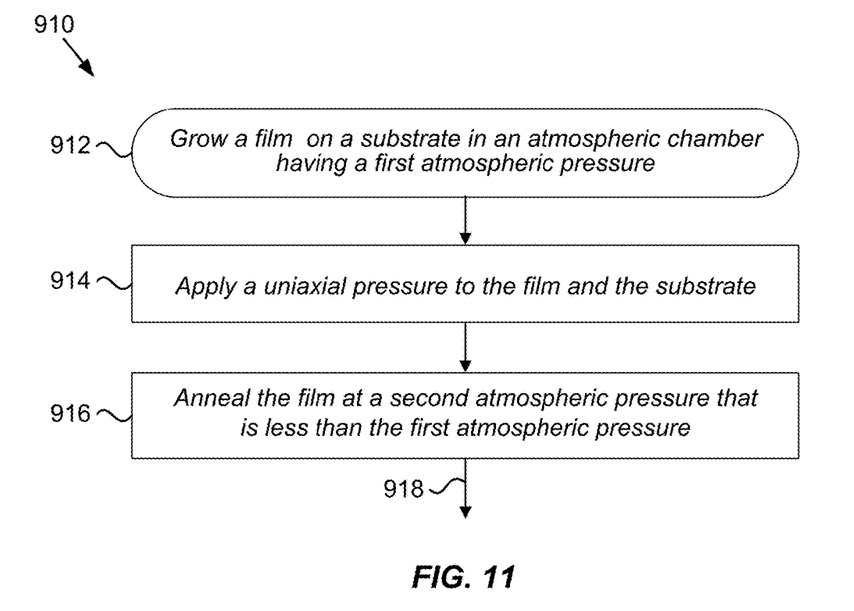
FIG. 11 shows a flowchart of an embodiment of a step for providing a film having an initial uniform oxygen state on a substrate in accordance with the Method for Producing High-Temperature Superconducting Films Having Sharp Charge Doping Discontinuities.

In some embodiments, the step 910 includes steps 912-916 as shown in FIG. 11. Step 912 involves growing a film on the substrate in an atmospheric chamber at a given temperature having a first oxygen atmospheric pressure, where the resulting film has an oxygen content of x≅7. Step 914 involves applying a uniaxial pressure to the film and the substrate. Step 916 involves annealing the film at a second oxygen atmospheric pressure, where the second oxygen atmospheric pressure is less than the first oxygen atmospheric pressure. Method 900 may then proceed along flow path 918 to step 920.

Step 920 involves annealing the film in a thermal gradient annealing device while applying a steady-state thermal gradient and a uniaxial pressure until the film comprises two or more discrete regions, where at least one of the discrete regions has a final stabilized oxygen state different from the initial uniform oxygen state. The final stabilized oxygen states may be one of <1>, <1⁴0>, <1³0110>, and <10>, where the oxygen content at final stabilized oxygen state <1⁴0> is about 6.80, the oxygen content at final stabilized oxygen state <1³0110> is about 6.72, and the oxygen content at final stabilized oxygen state <10> is about 6.5.

As an example, steps 910 and 920 are performed by system 10 shown in FIG. 1. In some embodiments, the steady-state thermal gradient ranges from about 290° C. to about 395° C. In some embodiments, the uniaxial pressure is between about 40 MPa and about 200 MPa, such as, for example, about 100 MPa. In some embodiments, the film is annealed at an oxygen atmospheric pressure of about 120 mTorr. In some embodiments, the film is annealed in the thermal gradient annealing device for about 12 hours.

Many modifications and variations of the embodiments disclosed herein are possible in light of the above description. Within the scope of the appended claims, the disclosed embodiments may be practiced otherwise than as specifically described. Further, the scope of the claims is not limited to the implementations and embodiments disclosed herein, but extends to other implementations and embodiments as may be contemplated by those having ordinary skill in the art.

I claim:

1. A method comprising the steps of:
   providing a film on a substrate, the film comprising a high-temperature compound belonging to the class of compounds having a compositional form of $R_{1-y}M_yBa_2Cu_{3-z}T_zO_x$, wherein 6≤x≤7, wherein 0≤y≤1, wherein 0≤z≤1, wherein R comprises at least one of a rare earth and calcium, wherein M comprises at least one of a rare earth distinct from that of R and calcium if absent from R, wherein T comprises at least one of cobalt (Co), iron (Fe), nickel (Ni), and zinc (Zn), wherein the film has an initial uniform oxygen state; and
   annealing the film in a thermal gradient annealing device while applying a steady-state thermal gradient and a uniaxial pressure until the film comprises two or more discrete regions, wherein the uniaxial pressure is between about 40 MPa and about 200 MPa, wherein at least one of the discrete regions has a final stabilized oxygen state different from the initial uniform oxygen state.

2. The method of claim 1, wherein the substrate comprises at least one characteristic of: a structurally matching lattice interface to the film, a melting point in a range of at least approximately 800° C., a non-reactive chemical composition, and at least one insulating electrical property.

3. The method of claim 1, wherein the substrate comprises one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ).

4. The method of claim 1, wherein the step of providing a film on a substrate comprises:
   growing the film on the substrate in an atmospheric chamber at a given temperature having a first oxygen atmospheric pressure, wherein the resulting film has an oxygen content of x≅7;
   applying a uniaxial pressure to the film and the substrate; and
   annealing the film at a second oxygen atmospheric pressure, wherein the second oxygen atmospheric pressure is less than the first oxygen atmospheric pressure.

5. The method of claim 1, wherein the steady-state thermal gradient ranges from about 290° C. to about 395° C.

6. The method of claim 1, wherein the uniaxial pressure is about 100 MPa.

7. The method of claim 1, wherein the film is annealed at an oxygen atmospheric pressure of about 120 mTorr.

8. The method of claim 1, wherein each of the final stabilized oxygen states is one of <1>, <1⁴0>, <1³0110>, and <10>, wherein the oxygen content at final stabilized oxygen state <1⁴0> is about 6.80, the oxygen content at final stabilized oxygen state <1³0110> is about 6.72, and the oxygen content at final stabilized oxygen state <10> is about 6.5.

9. The method of claim 1, wherein the step of annealing the film in the thermal gradient annealing device is performed for about 12 hours.

10. A method comprising the steps of:
provide a film of $YBa_2CuO_x$ on a substrate, where $6 \leq x \leq 7$, wherein the film has an initial uniform oxygen state; and
annealing the film in a thermal gradient annealing device while applying a steady-state thermal gradient and a uniaxial pressure until the film comprises at least two discrete regions each having a final stabilized oxygen state, wherein the uniaxial pressure is between about 40 MPa and about 100 MPa, wherein at least one of the discrete regions has a final stabilized oxygen state different from the initial uniform oxygen state, wherein each of the final stabilized oxygen states is one of $<1>$, $<1^40>$, $<1^30110>$, and $<10>$.

11. The method of claim 10, wherein the oxygen content at final stabilized oxygen state $<1^40>$ is about 6.80, the oxygen content at final stabilized oxygen state $<1^30110>$ is about 6.72, and the oxygen content at final stabilized oxygen state $<10>$ is about 6.5.

12. The method of claim 10, wherein the steady-state thermal gradient ranges from about 290° C. to about 395° C.

13. The method of claim 10, wherein the uniaxial pressure is about 100 MPa.

14. The method of claim 10, wherein the thermal gradient annealing device comprises a heat source and a heat sink, wherein the film is disposed between and in direct contact with the heat source and the heat sink, wherein the first region is located proximate to the heat sink and the fourth region is located proximate to the heat source.

15. The method of claim 10, wherein the substrate comprises one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ).

16. A method comprising the steps of:
providing a film of $YBa_2CuO_x$ on a substrate, where $6 \leq x \leq 7$, wherein the film has an initial uniform oxygen state;
positioning the film in a thermal gradient annealing device comprising heat source and a heat sink such that the film is disposed between and in direct contact with the heat source and the heat sink; and
annealing the film in the thermal gradient annealing device while applying a steady-state thermal gradient ranging from about 290° C. to about 395° C. and a uniaxial pressure of about 100 MPa for about 12 hours until the film comprises four discrete regions each having a final stabilized oxygen state different from the initial uniform oxygen state, wherein a first region has a final stabilized oxygen state of $<1>$, a second region has a final stabilized oxygen state of $<1^40>$, a third region has a final stabilized oxygen state of $<1^30110>$, and a fourth region has a final stabilized oxygen state of $<10>$, wherein the first region is located proximate to the heat sink and the fourth region is located proximate to the heat source.

17. The method of claim 16, wherein the oxygen content at final stabilized oxygen state $<1^40>$ is about 6.80, the oxygen content at final stabilized oxygen state $<1^30110>$ is about 6.72, and the oxygen content at final stabilized oxygen state $<10>$ is about 6.5.

18. The method of claim 16, wherein the substrate comprises one of: aluminum oxide ($Al_2O_3$), magnesium oxide (MgO), magnesium aluminate ($MgAl_2O_4$), zinc oxide (ZnO), strontium titanate ($SrTiO_3$), lanthanum aluminate ($LaAlO_3$), lithium niobate ($LiNbO_3$), neodynium gallate ($NdGaO_3$), strontium lanthanum aluminate ($SrLaAlO_3$), strontium lanthanum gallate ($SrLaGaO_3$), ytterbium aluminate ($YtAlO_3$), and yttria-($Y_2O_3$)-stabilized zirconia ($ZrO_2$) (YSZ).

* * * * *